US008222644B2

(12) United States Patent
Yang et al.

(10) Patent No.: US 8,222,644 B2
(45) Date of Patent: Jul. 17, 2012

(54) FAN-OUT UNIT AND THIN-FILM TRANSISTOR ARRAY SUBSTRATE HAVING THE SAME

(75) Inventors: Sung-Hoon Yang, Yongin-si (KR); So-Woon Kim, Suwon-si (KR); Yeon-Ju Kim, Suwon-si (KR); So-Hyun Lee, Yongin-si (KR); Kwang-Hoon Lee, Anyang-si (KR); Mun-Soo Park, Suwon-si (KR); Jung-Hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 288 days.

(21) Appl. No.: 12/637,658

(22) Filed: Dec. 14, 2009

(65) Prior Publication Data
US 2010/0155729 A1    Jun. 24, 2010

(30) Foreign Application Priority Data
Dec. 24, 2008   (KR) .................. 10-2008-0133655

(51) Int. Cl.
*H01L 29/15* (2006.01)
*G02F 1/1345* (2006.01)

(52) U.S. Cl. ............. 257/59; 257/72; 349/149; 349/151

(58) Field of Classification Search .................. 349/149, 349/151; 257/59, 72
See application file for complete search history.

(56) References Cited

U.S. PATENT DOCUMENTS
2007/0195254 A1   8/2007   Lee et al.
2008/0157364 A1 * 7/2008   Yang et al. .................... 257/741

FOREIGN PATENT DOCUMENTS
KR   1020040013534 A   2/2004
KR   1020080063553 A   7/2008
KR   1020080074367 A   8/2008

* cited by examiner

*Primary Examiner* — Long Tran
(74) *Attorney, Agent, or Firm* — Innovation Counsel LLP

(57) ABSTRACT

A fan-out unit which can control a resistance difference among channels with efficient space utilization and a thin-film transistor (TFT) array substrate having the fan-out unit are presented. The fan-out unit includes: an insulating substrate; a first wiring layer which is formed on the insulating substrate and connected to a pad; a second wiring layer which is formed on the insulating substrate and connected to a TFT; and a resistance controller which is connected between the first wiring layer and the second wiring layer and includes a plurality of first resistors extending parallel to the first wiring layer and a plurality of second resistors extending perpendicular to the first resistors and alternately connecting to the first resistors, wherein the first resistors are longer than the second resistors.

16 Claims, 10 Drawing Sheets

FAN-OUT UNIT AND THIN-FILM TRANSISTOR ARRAY SUBSTRATE HAVING THE SAME

CROSS-REFERENCE TO RELATED APPLICATION

This application claims, under 35 U.S.C. §119, priority to and the benefit of Korean Patent Application No. 10-2008-0133655 filed in the Korean Intellectual Property Office on Dec. 24, 2008, the entire content of which is incorporated herein by reference.

BACKGROUND OF THE INVENTION

1. Field of the Invention

The present invention relates to the design and fabrication of a fan-out unit which connects a thin-film transistor (TFT) array on a substrate with input/output IC circuitry for an LCD display system.

2. Description of the Related Art

Liquid crystal displays (LCDs) are among the most widely used flat panel displays. An LCD consists of a common electrode substrate, a control substrate having a thin-film transistor (TFT) array pattern, and a layer of liquid crystal solution sandwiched in between the substrates. When a voltage related to image data is applied across the liquid crystal layer in each pixel, an incident light is allowed to pass through in varying amounts according to the image data, thus constituting different levels of display intensity in the pixel. Therefore, a sequence of voltages corresponding to an image data array can generate a desired image on an LCD screen.

A fan-out unit is used to connect a group of gate lines or a group of data lines to a gate integrated circuit (IC) or a data IC and is typically formed in a peripheral region of a TFT array substrate. Usually the channels in a fan-out unit have different lengths and thus can have non-uniform resistance values among the gate lines or data lines, which affects image consistency. Therefore, it is desired to equalize the fan-out channel lengths.

In the past, the fan-out channels were arranged in zigzag forms to equalize the channel resistance. However, size and density of LCD have been increasing, and the channel numbers continue to grow on the ever shrinking edge spaces available for the fan-out circuitry. Consequently, there is little room left to improve resistance variation by adjusting the channel lengths only. Furthermore, a zigzag wire form bends a channel and increases its resistance. Thus, it is desired to minimize the channel bending.

SUMMARY OF THE INVENTION

Present invention provides a fan-out unit with minimum channel resistance non-uniformity and efficient space utilization and a thin-film transistor (TFT) array substrate having the same fan-out unit.

However, the present invention is not restricted to the one set forth herein. The above and other aspects of the present invention will become more apparent to one of ordinary skill in the art to which the present invention pertains by referencing the detailed description of the present invention given below.

One aspect of the present invention provides a fan-out unit including: an insulating substrate; a first wiring layer formed on the insulating substrate and connecting to a pad; a second wiring layer formed on the insulating substrate and connects to a TFT; and a resistance controller which connects the first wiring layer to the second wiring layer and includes a plurality of first resistors extending parallel to the first wiring layer and a plurality of second resistors extending perpendicular to the first resistors and alternately connect to the first resistors, wherein the first resistors are longer than the second resistors.

Another aspect of the present invention provides a TFT array substrate including: an insulating substrate; and a fan-out unit, wherein the fan-out unit includes: a first wiring layer formed on the insulating substrate and connects to a pad; a second wiring layer formed on the insulating substrate and connects to a TFT; and a resistance controller which connecting the first wiring layer to the second wiring layer, and includes a plurality of first resistors extending parallel to the first wiring layer and a plurality of second resistors extending perpendicular to the first resistors and alternately connected to the first resistors, wherein the first resistors are longer than the second resistors.

BRIEF DESCRIPTION OF THE DRAWINGS

The above and other aspects and features of the present invention will become more apparent by referencing to the attached drawings, in which.

DETAILED DESCRIPTION OF THE INVENTION

Figure 1:
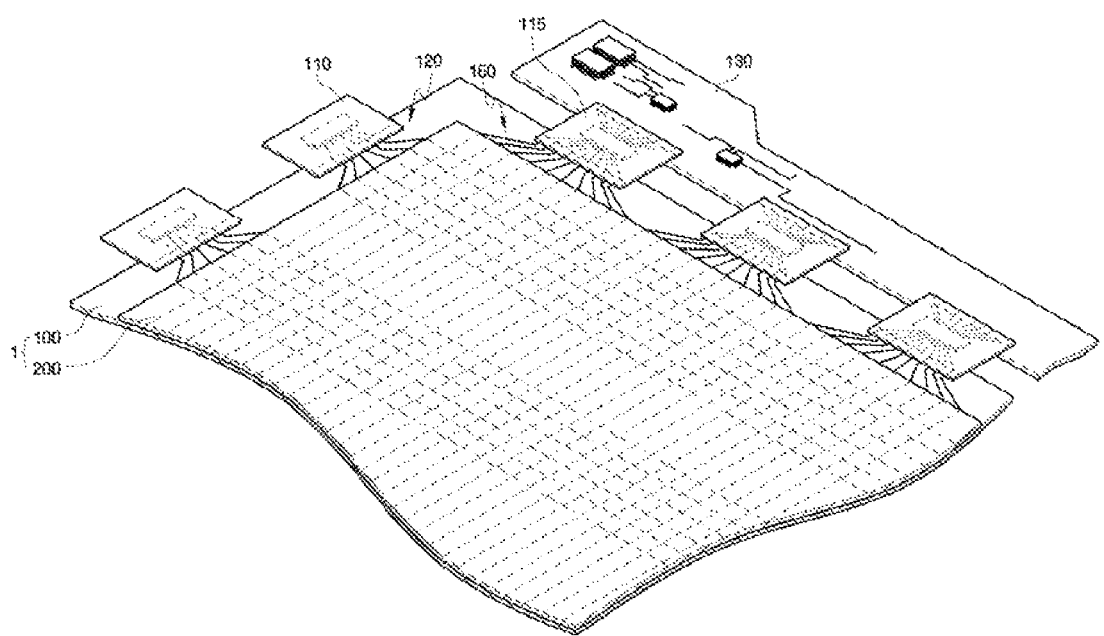
FIG. 1 is a partial perspective view of a display panel including fan-out units according to an exemplary embodiment of the present invention.

Exemplary embodiments of the present invention will now be described in detail with reference to the accompanying drawings. However, the present invention is not limited to these embodiments.

Like reference numerals refer to like elements throughout the specification. Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures.

Figure 2:
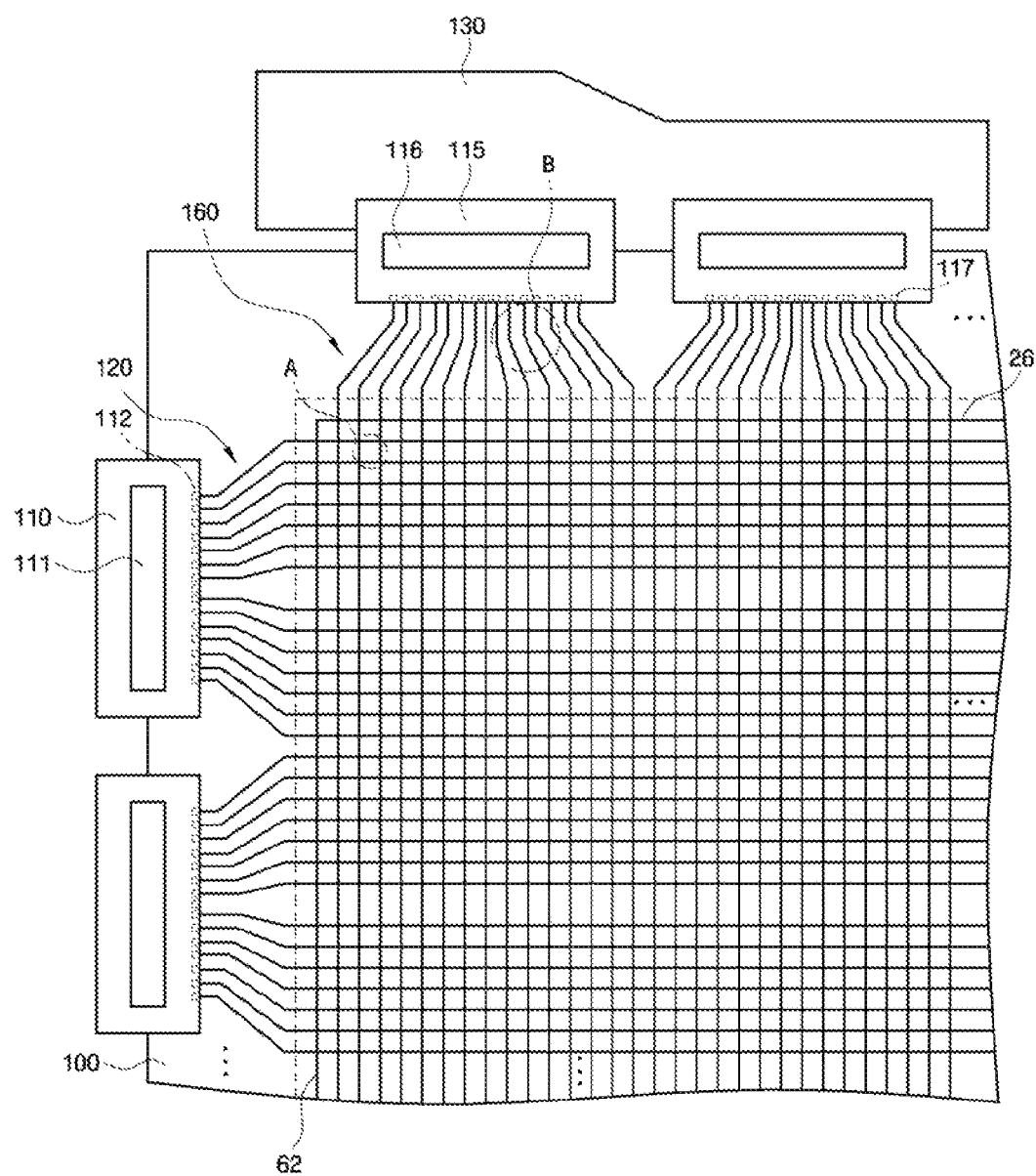
FIG. 2 is a partial overview of a thin-film transistor (TFT) array substrate in a display panel shown in FIG. 1.

Hereinafter, a display panel including a fan-out unit on a thin-film transistor (TFT) array substrate according to an exemplary embodiment of the present invention will be described in detail. FIG. 1 is a partial perspective view of a display panel 1 including fan-out units 120 and 160 according to an exemplary embodiment of the present invention. FIG. 2 is a partial plane view of a TFT array substrate 100 in a display device shown in FIG. 1.

In FIG. 1 and FIG. 2, the display device may include the display panel 1, first flexible films 110, second flexible films 115, and a printed circuit board (PCB) 130.

The display panel 1 includes the TFT array substrate 100 and an upper substrate 200 facing the TFT array substrate 100. The TFT array substrate 100 includes a gate line 26 (see FIG. 3), a data line 62 (see FIG. 3), a thin-film transistor TFT (see FIG. 3), and a pixel electrode 82 (see FIG. 3). The upper substrate 200 includes a black matrix, a color filter, and a common electrode. In addition, a liquid crystal layer (not shown) is interposed between the upper substrate 200 and the TFT array substrate 100.

Each of the first flexible films 110 is connected to the gate line 26 formed on the TFT array substrate 100. A gate-driving chip 111 may be mounted on each of the first flexible films 110. The gate-driving chip 111 is a semiconductor chip and may be mounted on one of the first flexible films 110 using, for example, wiring pattern and tape automated bonding (TAB) methods. The gate-driving chip 111 is electrically connected to the gate line 26 and transmits a gate signal to the gate line 26. Each channel of the fan-out units 120 connects a gate line 26 and its corresponding first flexible films 110. One side of every fan-out unit 120 connects to a pad 112 and is narrower than the other side which connects to the gate line 26. Thus, each of the first flexible films 110 contacts the pad 112 and the gate line 26 as well.

Each of the second flexible films 115 may include a wiring pattern formed on a base film and a data driving chip 116 electrically connected to the wiring pattern. The data driving chip 116 is a semiconductor chip and may be mounted on one of the second flexible films 115 using the wiring pattern and TAB methods. Each of the second flexible films 115 delivers a data driving signal to the transistor TFT via the data line 62. Each channel of the fan-out units 160 connects the data line 62 to a corresponding flexible film 115. One side of each of the fan-out units 160 connects to a pad 117 and is narrower than the other side which connects to the data line 62. Each of the second flexible films 115 contacts the pad 117 and the data line 62 as well.

Figure 3:
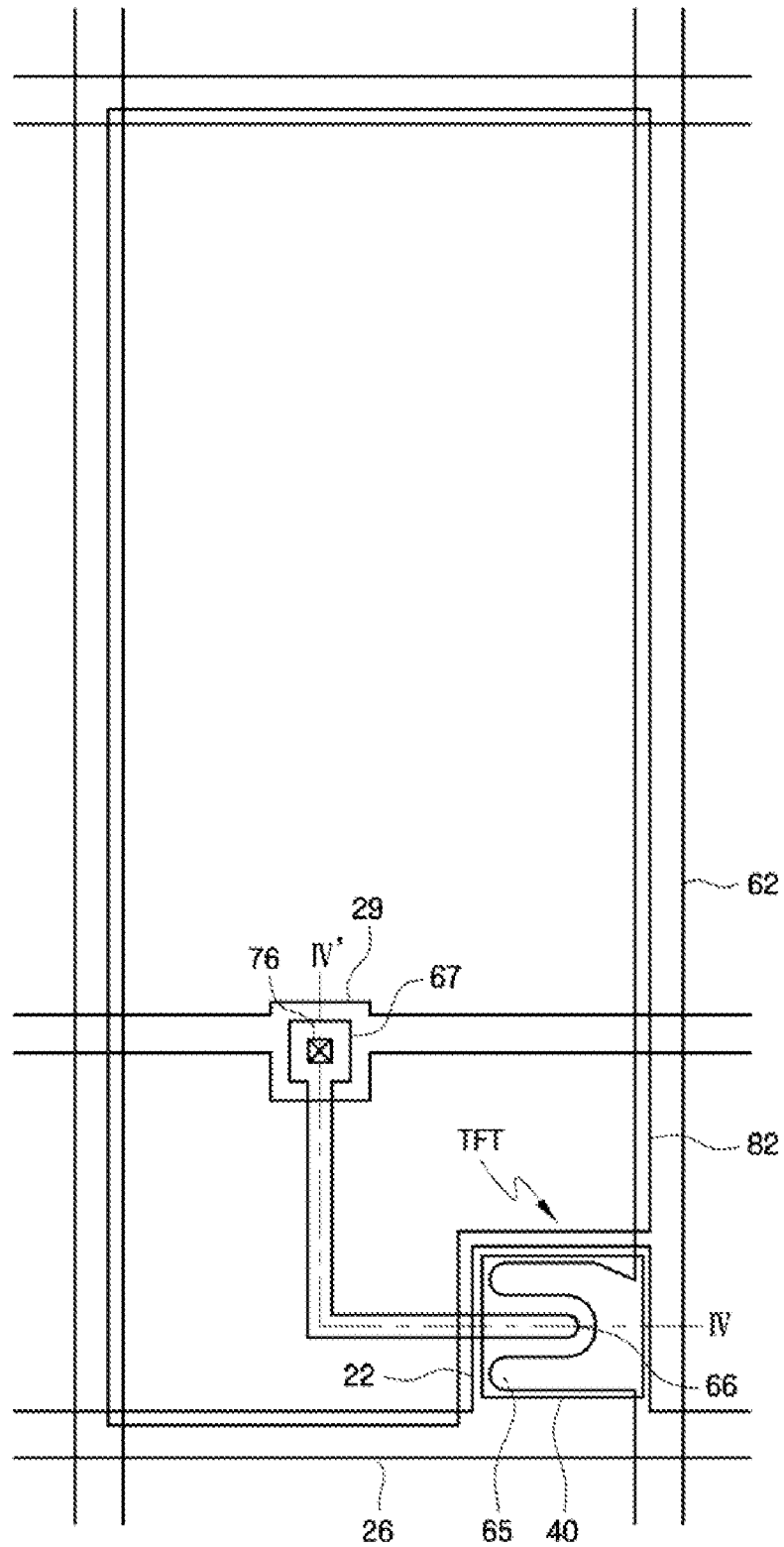
FIG. 3 is an enlarged view of a pixel in region A of the TFT array substrate shown in FIG. 2.
Figure 4:
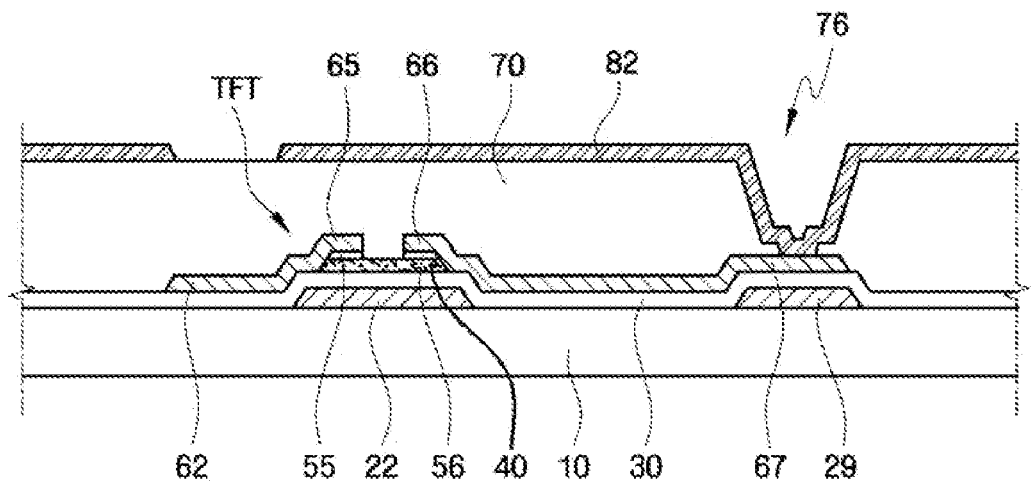
FIG. 4 is a cross-sectional view of the TFT array substrate taken along the line IV-IV' of FIG. 3.

Hereinafter, the TFT array substrate 100 according to the present embodiment will be described in more detail with reference to FIG. 3 and FIG. 4. FIG. 3 is an enlarged view of region A in the TFT array substrate 100 shown in FIG. 2. FIG. 4 is a cross-sectional view of the TFT array substrate taken along the line IV-IV' in FIG. 3.

In FIG. 3 and FIG. 4, an insulating substrate 10 is made of transparent glass or a material having low thermal expansion and high light-transmitting properties, such as transparent plastics. Gate wiring layers (i.e., a gate electrode 22, a gate line 26, and a storage line 29) are formed on the insulating substrate 10. The gate wiring layers typically contain a metal material, for example, aluminum and an aluminum alloy, silver and a silver alloy, copper and a copper alloy, molybdenum and a molybdenum alloy, chrome (Cr), titanium (Ti) or tantalum (Ta). In addition, the gate wiring layers may contain multiple conductive films (not shown), each having distinctive physical characteristics.

The storage line 29 is formed parallel to the gate line 26. The lines in the gate wiring layers extend in a first direction, e.g., the horizontal direction on the insulating substrate 10. The gate electrode 22 protrudes from the gate line 26, and the storage line 29 lies parallel to the gate line 26. TFT terminals are formed by a gate electrode 22, a source electrode 65 and a drain electrode 66.

A gate insulating film 30, made of silicon nitride (SiNx), is disposed on the gate wiring layers. A semiconductor layer 40, made of hydrogenated amorphous silicon or polycrystalline silicon, is disposed on the gate insulating film 30. The semiconductor layer 40 may have various shapes; for example, it may be an island or a line. In the present embodiment, the semiconductor layer 40 is an island, disposed under the data line 62 and extending above the gate electrode 22. The semiconductor layer 40 may also be lines formed by the same patterning process as the data line 62. Ohmic contact layers 55 and 56 are disposed on the semiconductor layer 40 and are made of materials such as silicide or n+ hydrogenated amorphous silicon doped with n-type impurities in high concentration. The ohmic contact layers 55 and 56 improve contact characteristics between the semiconductor layer 40 and the source electrode 65 or the drain electrode 66, if the improvement is necessary.

The ohmic contact layers 55 and 56 may form various shapes. They may be islands or lines depending on their locations. When they are disposed under the drain electrode 66 and the source electrode 65, they form island-shapes, as in the present embodiment. When they extend to under the data line 6, they form lines.

Data wiring layers are formed on the ohmic contact layers 55 and 56 and the gate insulating film 30. The data wiring layers include the data line 62, the source electrode 65, and the drain electrode 66.

The data line 62 extends in a second direction, e.g., a vertical direction, crossing the gate line 26. The data line 62 receives a data signal and delivers it to the source electrode 65.

The source electrode 65 extends from the data line 62. One end of the source electrode 65 connects to the data line 62, and the other end is disposed above and overlaps a portion of the semiconductor layer 40. One end of the drain electrode 66 is disposed above and overlaps a portion of the semiconductor layer 40. The drain electrode 66 and the source electrode 65 are separated from each other by a predetermined gap.

The source electrode 65, the drain electrode 66, and the gate electrode 22 constitute a TFT transistor, a switching device where a voltage applied to the gate electrode 22 switches on an electric current between the source electrode 65 and the drain electrode 66.

The data wiring layers may be a single film or multiple films including aluminum, chrome, molybdenum, tantalum, and titanium. The data wiring layers may be made of chrome, molybdenum-based metals, or refractory metals such as tantalum or titanium. In addition, the data wiring layers may have a multi-film structure (not shown) composed of a lower film (not shown), made of a refractory metal, and an upper film disposed on the lower film, made of a low resistivity material. Examples of multi-film structures include a chrome lower film and an aluminum upper film, or an aluminum lower film and a molybdenum upper film. Alternatively, the multi-film structure may be a triple-film structure containing molybdenum, aluminum, and molybdenum films.

A passivation layer 70 is coated on the data wiring layers and an exposed portion of the semiconductor layer 40. The passivation layer 70 may be made of a photoresist, an inorganic material such as silicon nitride or silicon oxide, or a low-k dielectric material such as a-Si:C:O or a-Si:O:F, via a plasma enhanced chemical vapor deposition process (PECVD). When the passivation layer 70 is made of an organic material, it may have a dual-film structure having an upper organic film and a lower inorganic film such as silicon nitride or silicon oxide, thus preventing the organics in the passivation layer 70 from contacting the exposed semiconductor layer 40.

A contact hole 76 is formed in the passivation layer 70 to expose the drain electrode 66.

A pixel electrode 82 is disposed on the passivation layer 70 with the shape of a pixel, and is electrically connected to the drain electrode 66 via the contact hole 76.

A data voltage applied to the pixel electrode 82 and the common electrode (not shown) aligns the liquid crystal molecules in between and thus adjusts light transmittance from a backlight assembly (not shown) to display an image on the liquid crystal display.

The pixel electrode 82 is made of a transparent conductor, such as indium tin oxide (ITO) or indium zinc oxide (IZO), in a transmission type of LCD, or a reflective conductor such as aluminum in a reflective type of LCD. Fan-out units 120 and 160 connect TFT arrays on the substrate to external devices. Fan-out units 120 are gate fan-out units, and fan-out units 160 are data fan-out units 160. Each channel of the fan-out unit 120 connects a gate line 26 to a corresponding connector in the first flexible film 110. Similarly, each channel of the fan-out unit 160 connects a data line 62 to a corresponding connector in the second flexible film 115. The fan-out units 120 and 160 are located around the TFT arrays in the peripheral regions of substrate 100.

Figure 5A:
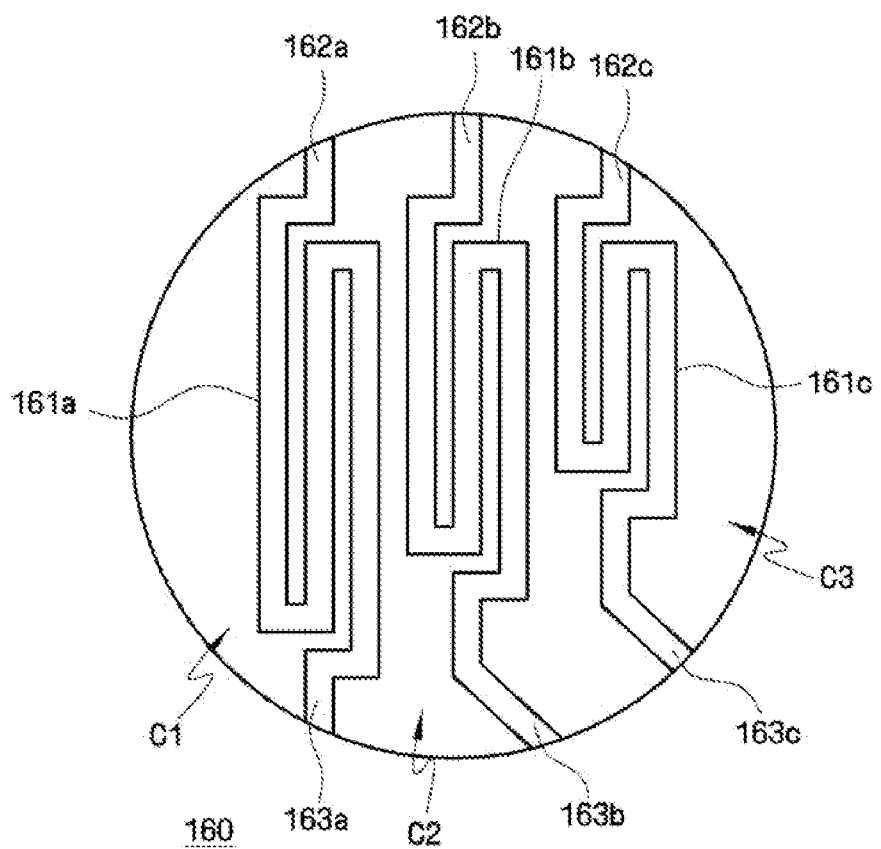
FIG. 5A is an enlarged view of the fan-out in region B of the TFT array substrate shown in FIG. 2.
Figure 5B:
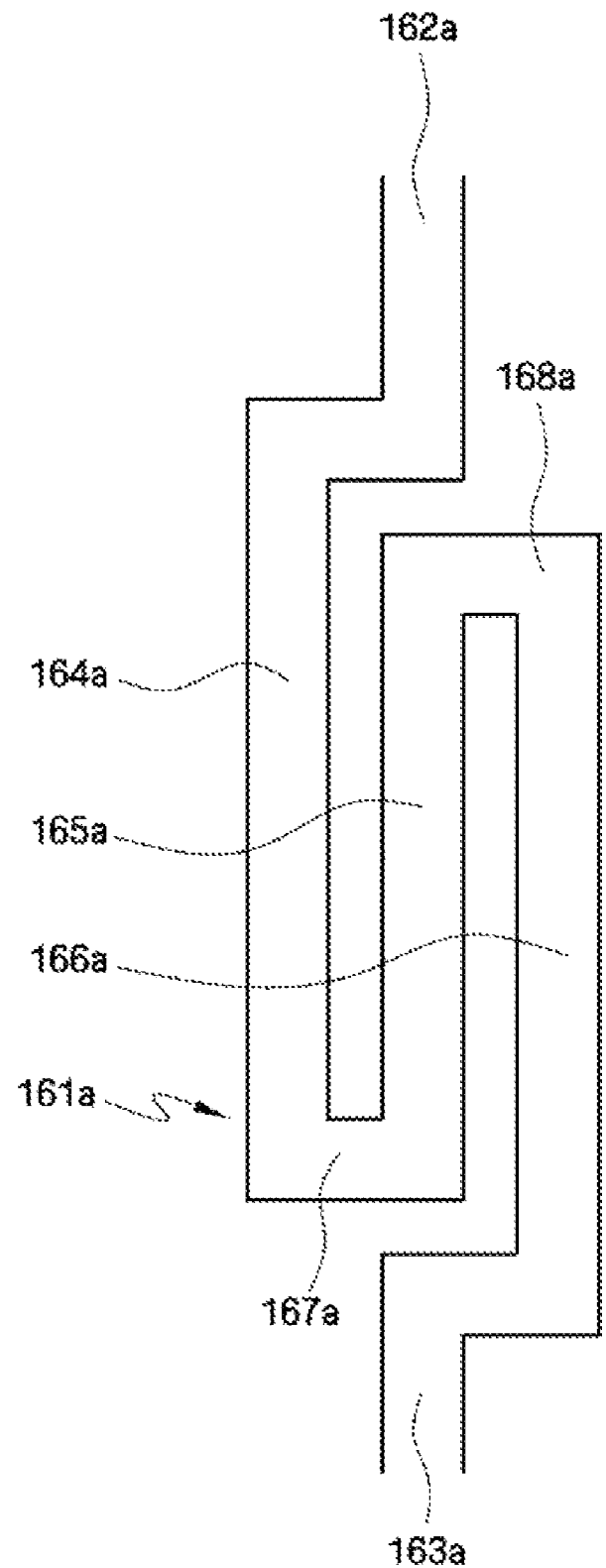
FIG. 5B is an enlarged view of a channel included in a fan-out unit shown in FIG. 5A.

Hereinafter, the fan-out units 120 and 160, according to the present embodiment, will be described in detail with reference to FIGS. 5A and 5B. FIG. 5A is an enlarged view of a region B of the TFT array substrate 100 shown in FIG. 2. FIG. 5B is an enlarged view of a channel included in a fan-out unit shown in FIG. 5A.

Each fan-out unit includes a plurality of channels. For example, three channels, C1 through C3, are shown in FIG. 5A. One terminal of each channel is connected to a pad 112 or 117, and the other terminal is connected to a gate line 26 or a data line 62. Each channel delivers a signal from the pad 112 or 117 to the gate line 26 or the data line 62.

The channels of a fan-out unit are designed such that the electrical resistance from a pad to its corresponding gate line or data line is substantially equal in all fan-out units. This goal is accomplished by forming a fan-out channel in three parts: 1) a first wiring layer at the end of the pad, for example, 162a, 162b, or 162c; 2) a second wiring layer at the input end of the gate or data line, for example, 163a, 163b, or 163c; and 3) a resistance controller part in between the first and the second wire layers, for example, 161a, 161b, or 161c. The resistance controllers have adjustable lengths in a winding pattern. If each of the channels C1 through C3 is formed such that the pad 112 or 117 is located at the shortest distance away from the gate line 26 or the data line 62, there is a large difference between lengths of the channels C1 through C3. When the channels C1 through C3 have different lengths, they have difference resistance values. Therefore, as shown in FIG. 5A, the channels C1 through C3 respectively include resistance controllers 161a through 161c to eliminate the resistance difference therebetween.

The fan-out unit, i.e., the first wiring layers 162a through 162c, the second wiring layers 163a through 163c, and the resistance controllers 161a through 161c may be formed together in the same layer. The gate line 26 and its related fan-out units 120 may be formed together in the same layer, and the data line 62 and its related fan-out units 160 may be formed together in the same layer.

On the other hand, the resistance controllers 161a through 161c may not be formed in the same layer as the gate line 26 or the data line 62. In some cases, the resistance controllers 161a through 161c in each gate fan-out unit 120 may be formed as separate bridge metals (not shown) in a data metal layer 62 connecting the first wiring layers 162a through 162c to the second wiring layers 163a through 163c, respectively. Similarly, the resistance controllers 161a through 161c connecting to the data line 62 in each data fan-out unit 160 may be formed using a gate metal layer or pixel metal layer.

The resistance controllers 161a through 161c in each fan-out unit 120 and 160 may be designed in a winding pattern in a plane parallel to the second wiring layers 163a through 163c of channels C1 through C3. In addition, the second wiring layers 163a through 163c of each gate fan-out unit 120 may extend parallel to the gate line 26, and similarly, the second wiring layers 163a through 163c of each data fan-out unit 160 may extend parallel to the data line 62. If the resistance controllers 161a through 161c are formed in a winding pattern in a layer parallel to the second wiring layers 163a through 163c, respectively, the number of bends in each resistance controllers 161a through 161c should be minimized to not reduce resistance, which will be described in detail below. The respective resistance controllers 161a through 161c in channels C1 through C3 have different lengths, and therefore different resistance.

FIG. 5B illustrates the structure of one fan-out channel including a first wiring layer 162a, a second wiring layer 163a, and a resistance controller 161a, which consists multiple sections of resistors 164a and 168a. Among the sections of resistors, those extending parallel to the first wiring layer 162a are named the first resistors, i.e. 164a to 166a, and those extending perpendicular to the first wiring layer are named the second resistors, i.e. 167a to 168a. The first resistors are parallel to each other at predetermined intervals, and are connected to each other by an adjacent second resistor, for example, 167a connects 164a to 165a. The second resistors have a fixed length, and the first resistors have variable lengths enabling resistance adjustment. The first resistors may be longer than the second resistors.

Figure 6:
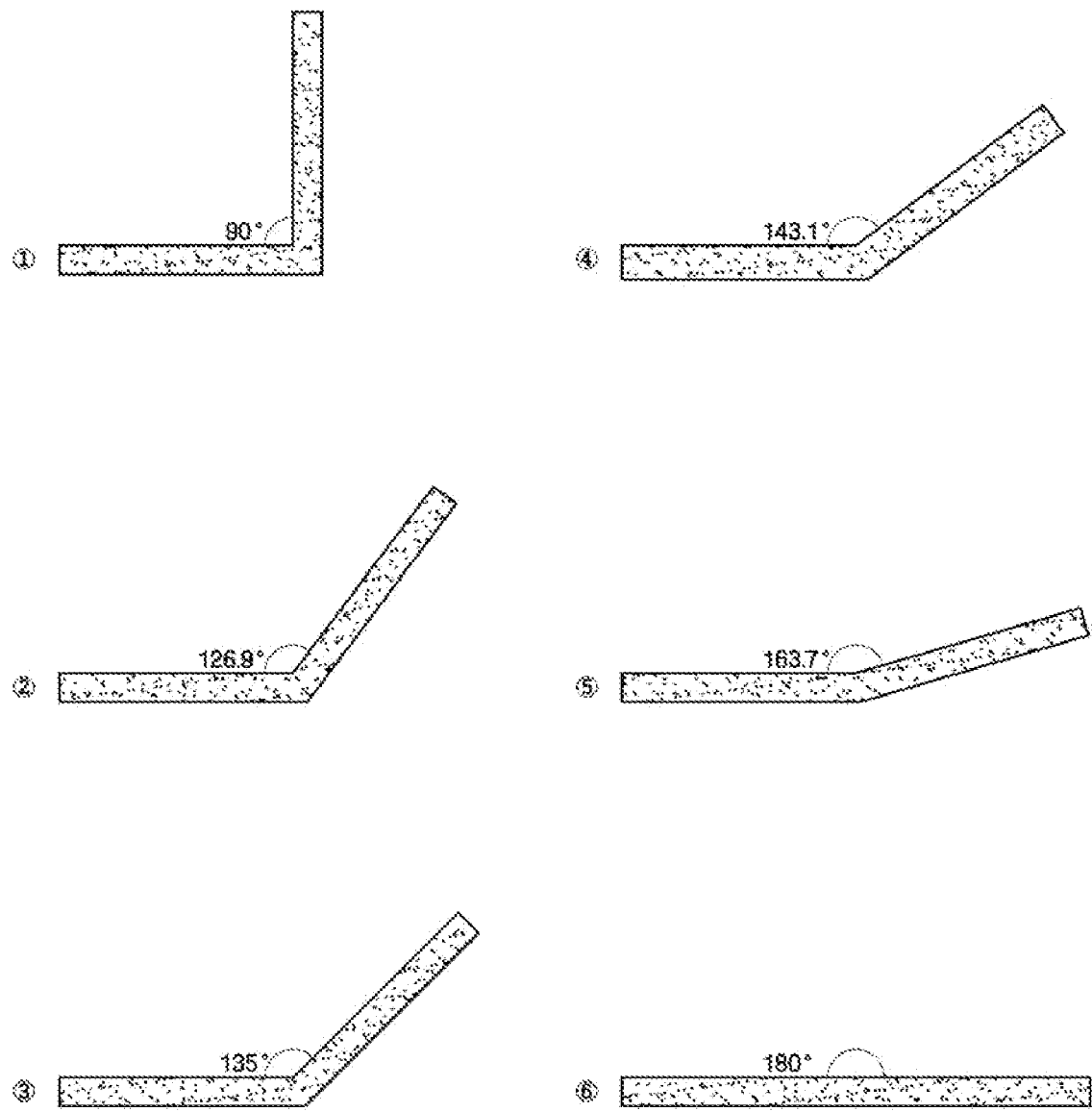
FIG. 6 illustrates the thin-film wiring patterns having different bending angles.

FIG. 6 illustrates six exemplary bending angles which connect the first resistors to the second resistors in the wiring pattern. Table 1 lists the calculated relative resistance values of the structures in FIG. 6.

TABLE 1

Comparison of resistance of the bending
structures in FIG. 6 (calculated)
Wiring pattern

| Angle (deg) | Resistance ratio (%) |
|---|---|
| 90 | 97.7 |
| 126.9 | 97.7 |
| 135 | 97.7 |
| 143.1 | 97.2 |
| 163.7 | 98.9 |
| 180 | 100 |

Table 1 shows that the resistance values increase with the bending angle, but large angle takes away space. Therefore, it is desirable to use 90 degree angle connections to maximize the control efficiency.

Figure 7:
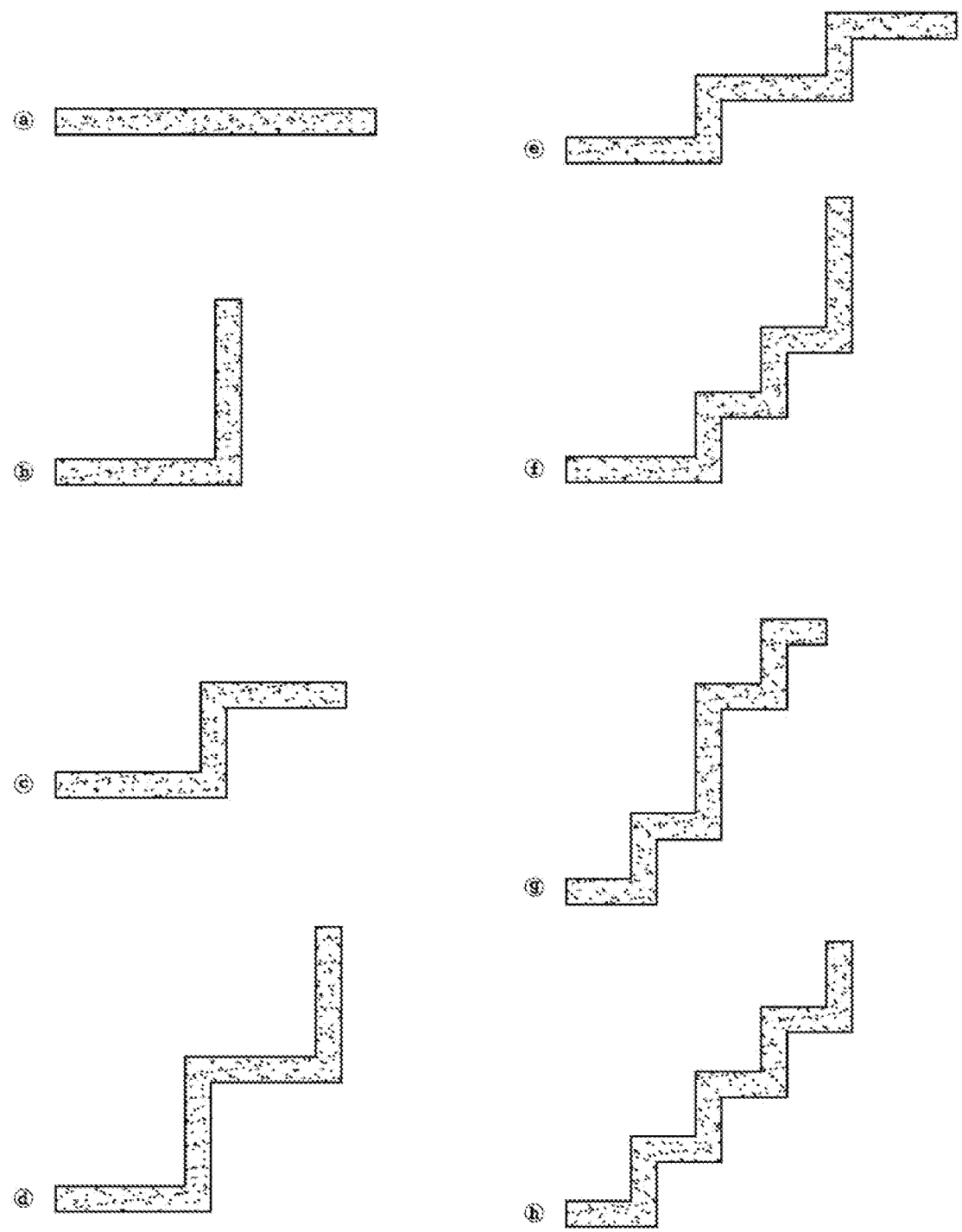
FIG. 7 illustrates thin-film wiring patterns having different numbers of bends.

FIG. 7 illustrates a variety of exemplary connecting structures, all of which are designed to have the same continuous length, but are bent different number of times at 90 degree angle.

TABLE 2

Comparison of resistance of the structures in FIG. 7 (calculated) Wiring Pattern

| No. of Bends | Resistance ratio (%) |
| --- | --- |
| 0 | 100 |
| 1 | 97.7 |
| 2 | 93.8 |
| 3 | 92.1 |
| 4 | 88.1 |
| 5 | 87.6 |
| 6 | 85.3 |
| 7 | 83.6 |

Table 2 shows that the resistance decreases with more bends in the wiring pattern, as the result of a shortened conducting path at each bend. Paths of electrons are reduced at a wiring bend. Therefore, it is more efficient to use less bends to retain resistance.

Figure 8A:
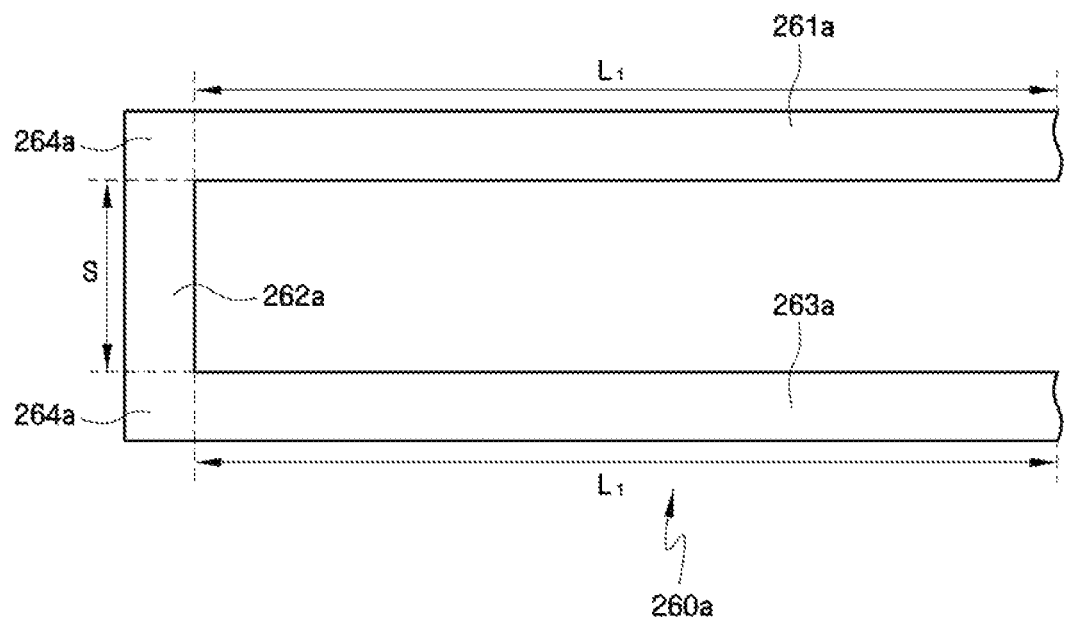
FIGS. 8A through 8C are views for explaining resistance control methods used from first through third resistance controllers respectively.
Figure 8B:
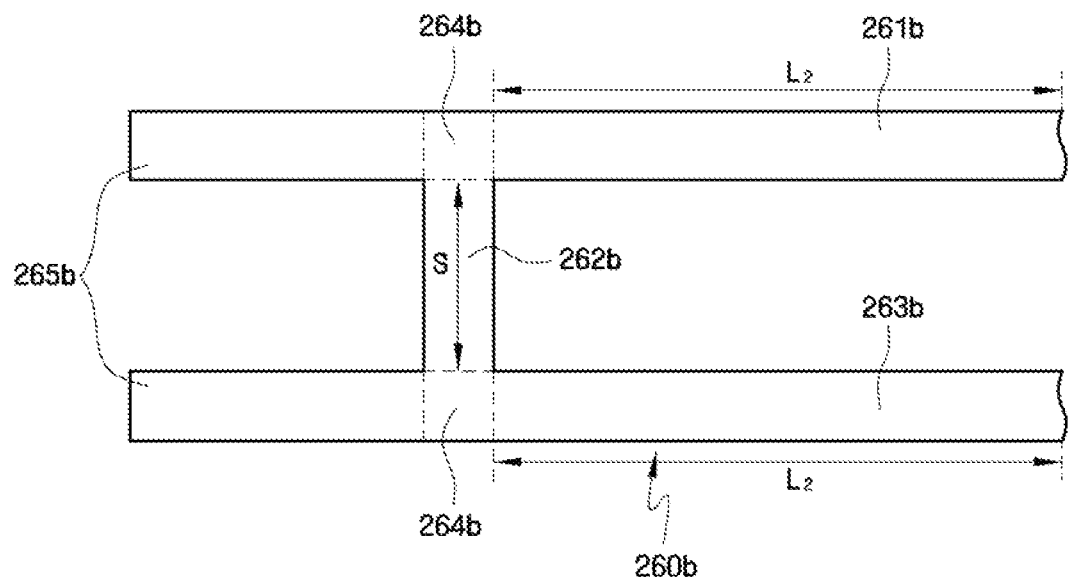
Figure 8C:
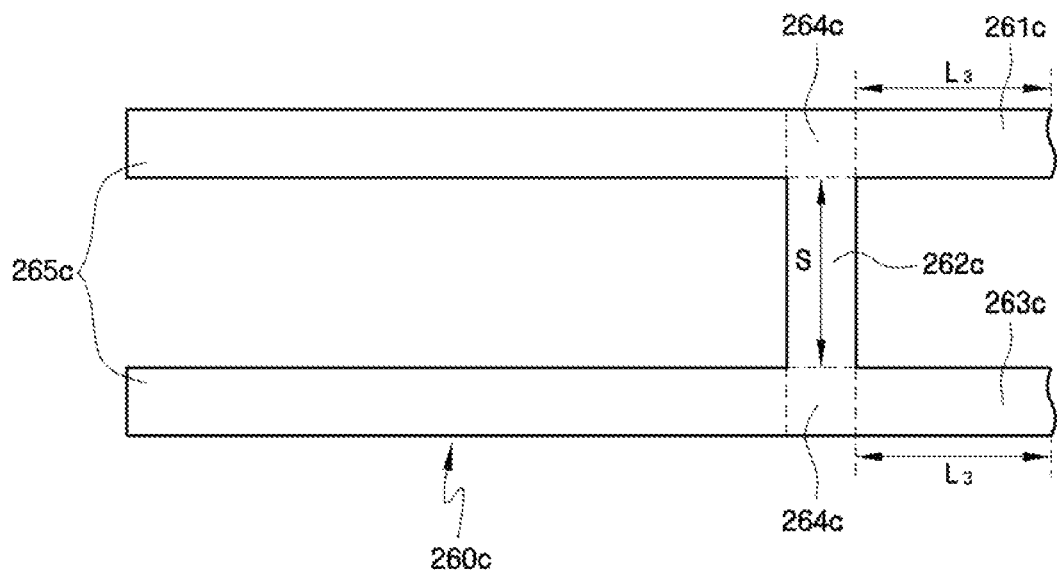

FIGS. 8A-8C explain the resistance control methods used in three resistance controllers 260a through 260c.

In FIG. 8A, a resistance controller 260a includes first resistors 261a and 263a, a second resistor 262a connecting 261a and 263a at the bends 264a.

A total resistance from 261a to 263a is determined by the total length of all the first and second resistors and their connecting bends. In general, bends contribute little to the total resistance, thus, the bend resistance is often omitted in the total resistance calculation. Therefore, the length of the resistance controller 260a in FIG. 8A is the sum length of the first and the second of resistors $2L_1+S$.

In FIG. 8B, a resistance controller 260b includes first resistors 261b and 263b, a second resistor 262b connecting 261b and 263b at the bends 264b. The dummy sections 265b are not electrically active, but help to maintain stable process conditions by providing an equivalent area density. Likewise, the resistance controller 260b has a total length $2 L_2+S$.

In FIG. 8C, a resistance controller 260c includes first resistors 261c and 263c, a second resistor 262c connecting 261b and 263b at the bends 264c. The electrically inactive dummy sections 265c extend away from the bends 264c and are longer than the bends in this case in FIG. 8B. Similarly, the resistance controller 260b has a total length $2 L_3+S$. The dummy wiring layers 265c are longer than the dummy wiring layers 265b of the second resistance controller 260b. Thus, an electric flow actually flows through a shorter portion of the third resistance controller 260c than that of the second resistance controller 260b.

Figure 9A:
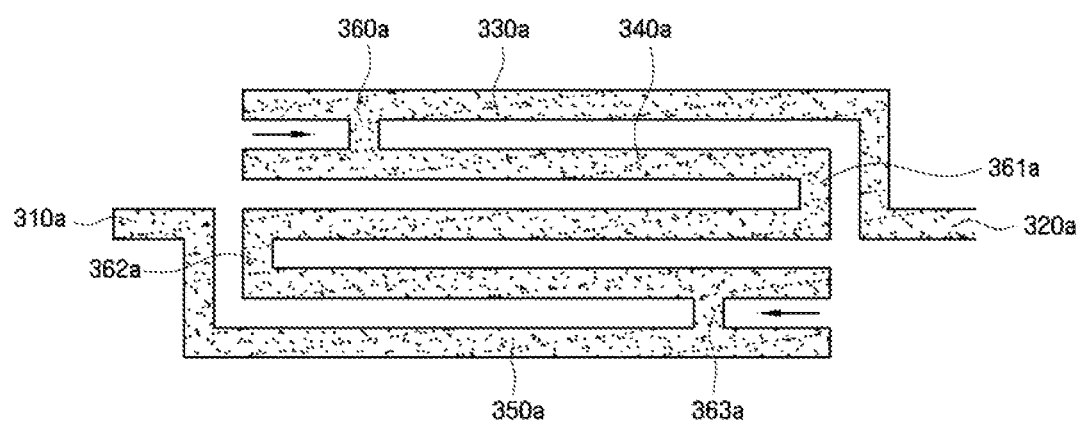
FIGS. 9A through 9C illustrate various resistance controllers according to modified embodiments of the present invention.
Figure 9B:
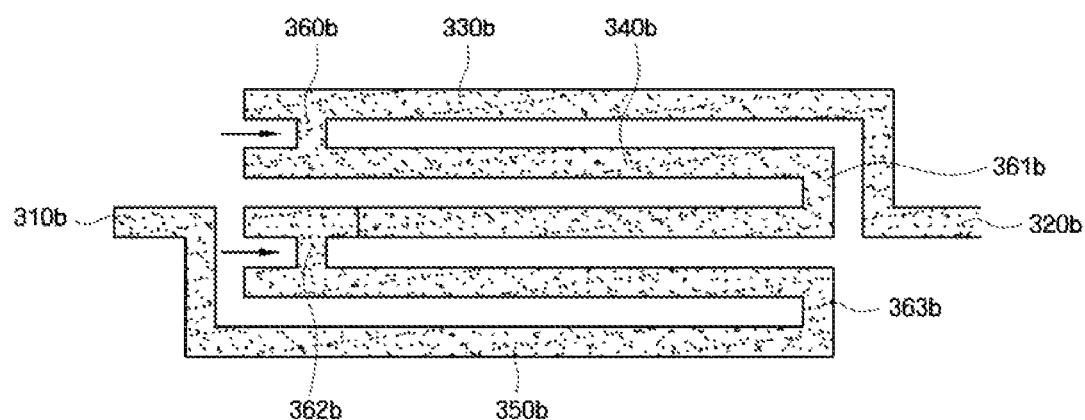
Figure 9C:
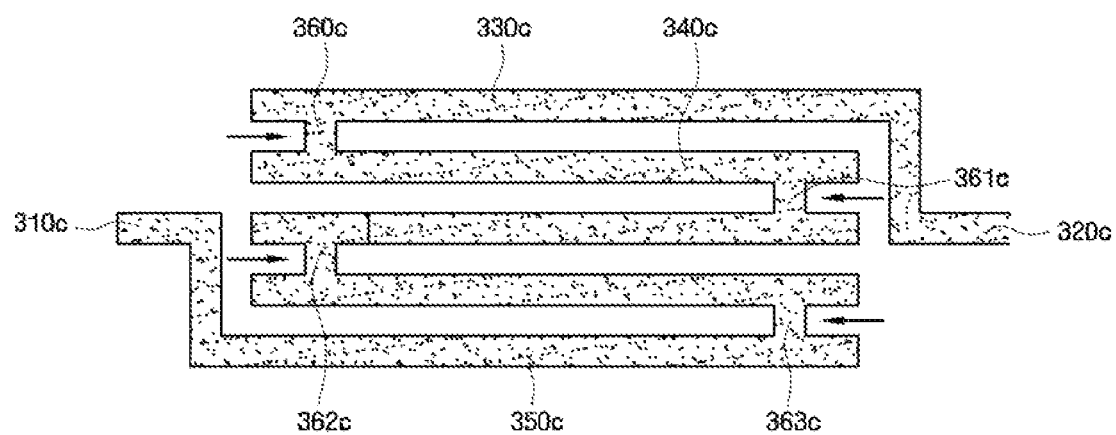

Among the three resistance controllers described in FIG. 8A to 8C, controller 260a has the highest resistance because of its longest active length, and 260c has the lowest resistance from its shortest active length. That is, the resistance values of the first through third resistance controllers 260a through 250c can be easily controlled by adjusting the positions of the connecting wiring layers 262a through 262c, respectively. In this case, the wiring layers of each of the first through third resistance controllers 260a through 260c have the same density. That is, if the resistance value of a resistance controller can be easily controlled while the densities of wiring layers thereof are maintained equal, conditions for forming each channel, e.g., for an ashing process for forming wiring, can be maintained constant. FIGS. 9A-9C illustrate additional types of resistance controllers according to another embodiment of the present invention.

In FIG. 9A, first resistors 330a, 340a and 350a and second resistors 360a, 361a, 362a and 363a are alternately arranged between a first wiring layer 310a and a second wiring layer 320a. The first resistors 330a, 340a, 350a have equal length, are parallel to each other and connected by the second resistors 360a through 363a. Precise control of the resistance value is accomplished by adjusting the contacting locations of the two outer resistors 330a and 350a and the bridging second resistors 360a and 363a.

In FIG. 9B, first resistors 330b through 350b and second resistors 360b through 363b are alternately arranged between a first wiring layer 310b and a second wiring layer 320b. The first resistors 330b through 350b of equal length are arranged parallel to each other and connected by the second resistors 360b through 363b. The second resistors 361b and 363b are formed at one end of the first resistors 330b through 350b near the second wiring layer. However, the locations of the second resistors 360b and 362b can be adjusted to control the resistance values of the first resistors 330b through 350b.

In FIG. 9C, first resistors 330c through 350c and second resistors 360c through 363c are alternately arranged between a first wiring layer 310c and a second wiring layer 320c. The first resistors 330c through 350c have equal lengths, are parallel to each other, and connected by the second resistors 360c through 363c. The locations of the second resistors 360c through 363c are adjustable with respect to the ends of the first resistors they are connecting to, thus the precise control of the resistance values of 330c to 350c is achieved.

While the present disclosure of invention has been particularly shown and described with reference to exemplary embodiments thereof, it will be understood by those of ordinary skill in the art in light of the foregoing that various changes in form and detail may be made therein without departing from the spirit and scope of the present teachings. The exemplary embodiments should be considered in a descriptive sense only and not for purposes of limitation.

What is claimed is:

1. A fan-out unit comprising:
   an insulating substrate;
   a first wiring layer which is formed on the insulating substrate and connected to a pad;
   a second wiring layer which is formed on the insulating substrate and connected to a thin-film transistor (TFT); and
   a resistance controller which is connected between the first wiring layer and the second wiring layer and comprises a plurality of first resistors extending parallel to the first wiring layer and a plurality of second resistors extending perpendicular to the first resistors and alternately connected to the first resistors,
   wherein the first resistors are longer than the second resistors, and
   wherein the first wiring layer, the second wiring layer and the resistance controller are formed on a same layer.

2. The fan-out unit of claim 1, wherein the resistance controller controls resistance by adjusting lengths of the first resistors.

3. The fan-out unit of claim 1, wherein each of the second resistors connects two adjacent first resistors and the resistance controller controls resistance by adjusting a location of the second resistor connecting the first resistors.

4. The fan-out unit of claim 3, wherein each of the second resistors is formed between two adjacent first resistors.

5. The fan-out unit of claim 3, wherein the first resistors have equal lengths and are arranged parallel to each other.

6. The fan-out unit of claim 5, wherein at least one second group resistor is separated from an end of a first group resistor.

7. The fan-out unit of claim 6, wherein one of the second resistors connecting to an outermost first resistor is separated from an end of the first resistor.

8. A TFT array substrate comprising:
an insulating substrate; and
a fan-out unit,
wherein the fan-out unit comprises:
a first wiring layer which is formed on the insulating substrate and connected to a pad;
a second wiring layer which is formed on the insulating substrate and connected to a TFT; and
a resistance controller which is connected between the first wiring layer and the second wiring layer and comprises a plurality of first resistors extending parallel to the first wiring layer and a plurality of second resistors extending perpendicular to the first resistors and alternately connected to the first resistors,
wherein the first resistors are longer than the second resistors, and
wherein the first wiring layer, the second wiring layer and the resistance controller are formed on a same layer.

9. The TFT array substrate of claim 8, wherein the resistance controller controls resistance by adjusting lengths of the first resistors.

10. The TFT array substrate of claim 8, further comprising a gate line which is electrically connected to the second wiring layer and extends parallel to the first wiring layer.

11. The TFT array substrate of claim 8, further comprising a data line which is electrically connected to the second wiring layer and extends parallel to the first wiring layer.

12. The TFT array substrate of claim 8, wherein each of the second resistors connects two adjacent first resistors and the resistance controller controls resistance by adjusting a location of the second resistor connecting the first resistors.

13. The TFT array substrate of claim 12, wherein the first resistors have equal lengths and are arranged parallel to each other.

14. The TFT array substrate of claim 13, wherein at least one second resistor is separated from an end of one first resistor.

15. The TFT array substrate of claim 14, wherein one of the second resistors connecting to an outermost first resistor is separated from an end of first resistor.

16. The TFT array substrate of claim 12, wherein each of the second resistors is formed between two adjacent first resistors.

* * * * *